(12) United States Patent
Ozminkowski

(10) Patent No.: US 11,411,784 B1
(45) Date of Patent: Aug. 9, 2022

(54) MULTIPLE PHASE DRIVE GENERATOR

(71) Applicant: Rockwell Collins, Inc., Cedar Rapids, IA (US)

(72) Inventor: Michael Ozminkowski, Sachse, TX (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 17/208,814

(22) Filed: Mar. 22, 2021

(51) Int. Cl.
H04L 25/49 (2006.01)
H03M 1/12 (2006.01)
H04B 1/04 (2006.01)

(52) U.S. Cl.
CPC .......... H04L 25/4902 (2013.01); H03M 1/12 (2013.01); H04B 1/0475 (2013.01)

(58) Field of Classification Search
CPC ..... H04L 25/4902; H03M 1/12; H04B 1/0475
USPC .......................................................... 455/91
See application file for complete search history.

(56) References Cited

U.S. PATENT DOCUMENTS

| | | |
|---|---|---|
| 5,859,605 A | 1/1999 | Raghavan et al. |
| 6,493,398 B1 | 12/2002 | Erisman |
| 7,847,730 B2 | 12/2010 | Ryba |
| 8,022,849 B2 | 9/2011 | Zhang et al. |
| 9,025,699 B2 | 5/2015 | Jeckeln |
| 9,385,831 B2 | 7/2016 | Marr et al. |
| 9,680,497 B2* | 6/2017 | Pagnanelli .......... H03M 1/1038 |
| 10,057,103 B2 | 8/2018 | Sen et al. |
| 10,069,662 B2 | 9/2018 | Papananos et al. |
| 10,284,413 B2 | 5/2019 | Morris et al. |
| 10,520,596 B2 | 12/2019 | Kurashige |
| 10,812,087 B2 | 10/2020 | Yu et al. |

* cited by examiner

*Primary Examiner* — Tomi Skibinski
(74) *Attorney, Agent, or Firm* — Suiter Swantz pc llo (57) ABSTRACT

A system for producing a for digitally producing amplifier drive signals for high power transmission includes signal generators to produce, based on the desired transmit frequency and modulation, a high digital pulse, low digital pulse, or no digital pulse of the desired pulse width and phase relationship. The drive signal is a three-level signal, having states of "1", "0", and "−1". A drive signal will direct the amplifier to output either its high voltage rail, 0 volts, or its low voltage rail. Multiple signal sets may be used to independently generate pulses based on differently phase shifted signals. These multiple drive signals can be used to drive multiple amplifiers, whose combined output produces a stair-step approximation to the desired transmit signal.

20 Claims, 8 Drawing Sheets

MULTIPLE PHASE DRIVE GENERATOR

BACKGROUND

Existing phase drive generators utilize a combined network of solid-state power amplifiers, each solid-state amplifier activated at a different time to give a combined stair-step approximation to a sine wave at the combined output. A specific phasing approach of the amplifier drives may result in a reduce harmonic content of the combined response relative to that of the individual amplifiers. Analog circuitry that takes a radio frequency (RF) input to create the phase drive signals requires a large number of components and hand tuning at the board level, and then again at the line-replaceable unit (LRU) level. Various numbers of phase drives/amplifiers can be used, depending on the desired output power and the amount of harmonic suppression that is required. Often, but not exclusively, the phase drive outputs have a 120° pulse width, and are a symmetrical waveform. Waveform symmetry minimizes even harmonics and a 120° pulse width suppress the third harmonic. Combining these phase drive signals can result in suppressing odd harmonics of the $5^{th}$ harmonic and above. The hardware that creates these drive signals to the amplifiers is called the Multiple Phase Drive Generator (MPDG).

SUMMARY

In one aspect, embodiments of the inventive concepts disclosed herein are directed to a system and method for digitally producing amplifier drive signals for high power transmission. Based on the desired transmit frequency and modulation, signal generators produce a high digital pulse, low digital pulse, or no digital pulse of the desired pulse width and phase relationship. The drive signal is a three-level signal, having states of "1", "0", and "−1". A drive signal will direct the amplifier to output either its high voltage rail, 0 volts, or its low voltage rail.

In a further aspect, multiple signal sets are used to independently generate pulses based on differently phase shifted signals. These multiple drive signals can be used to drive multiple amplifiers, whose combined output produces a stair-step approximation to the desired transmit signal.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for digitally producing amplifier drive signals for high power transmission. Based on the desired transmit frequency and modulation, signal generators produce a high digital pulse, low digital pulse, or no digital pulse of the desired pulse width and phase relationship.

Figure 1A:
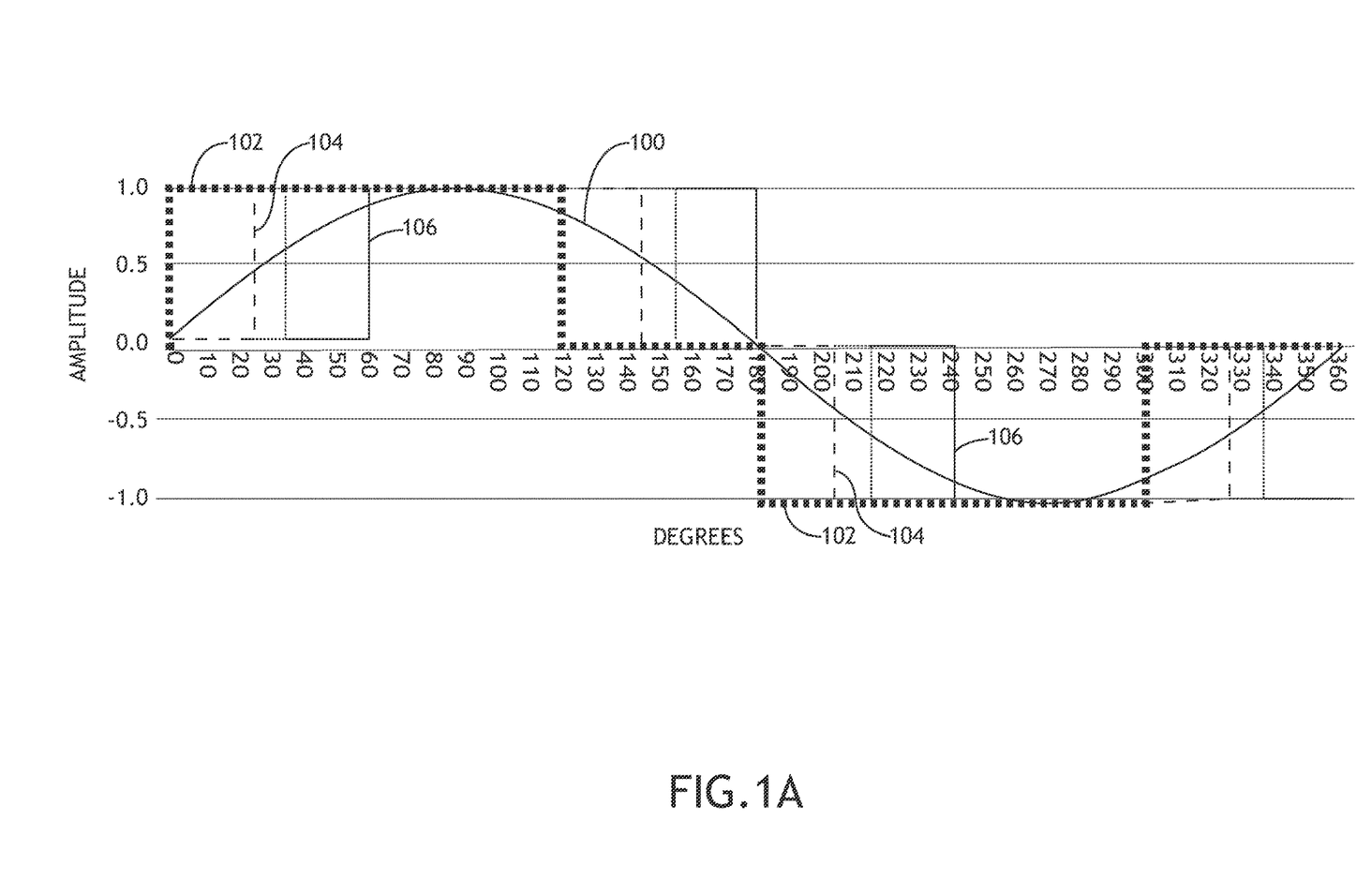
FIG. 1A shows a graph of a representative processes for creating a transmit signal.
Figure 1B:
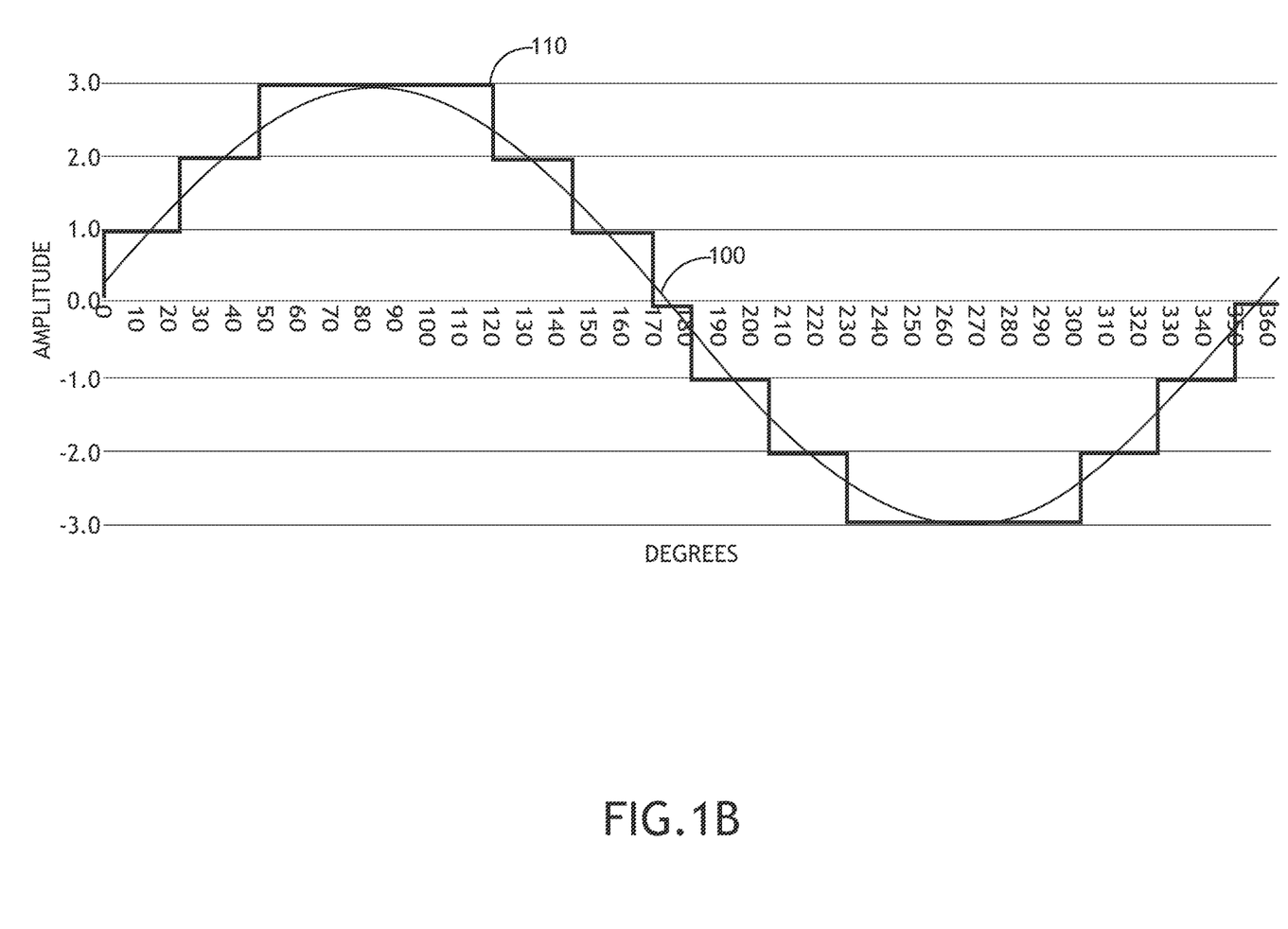
FIG. 1B shows a graph of a representative transmit signal.

Referring to FIGS. 1A-1B, graphs of a representative processes for creating a transmit signal are shown. When generating a driver signal, multiple phase shifter wave forms 102, 104, 106 are generated and combined to approximate a sine wave 100 or other regular driver wave. The combined signal 110 is generally only a rough approximation of the sine wave 100. Each of the pulse drive signals 102, 104, 106 will have substantial harmonic content, while, with a proper phasing approach, the combined approximation of the sine wave will have substantially less harmonic content due to harmonic cancellation.

Figure 2:
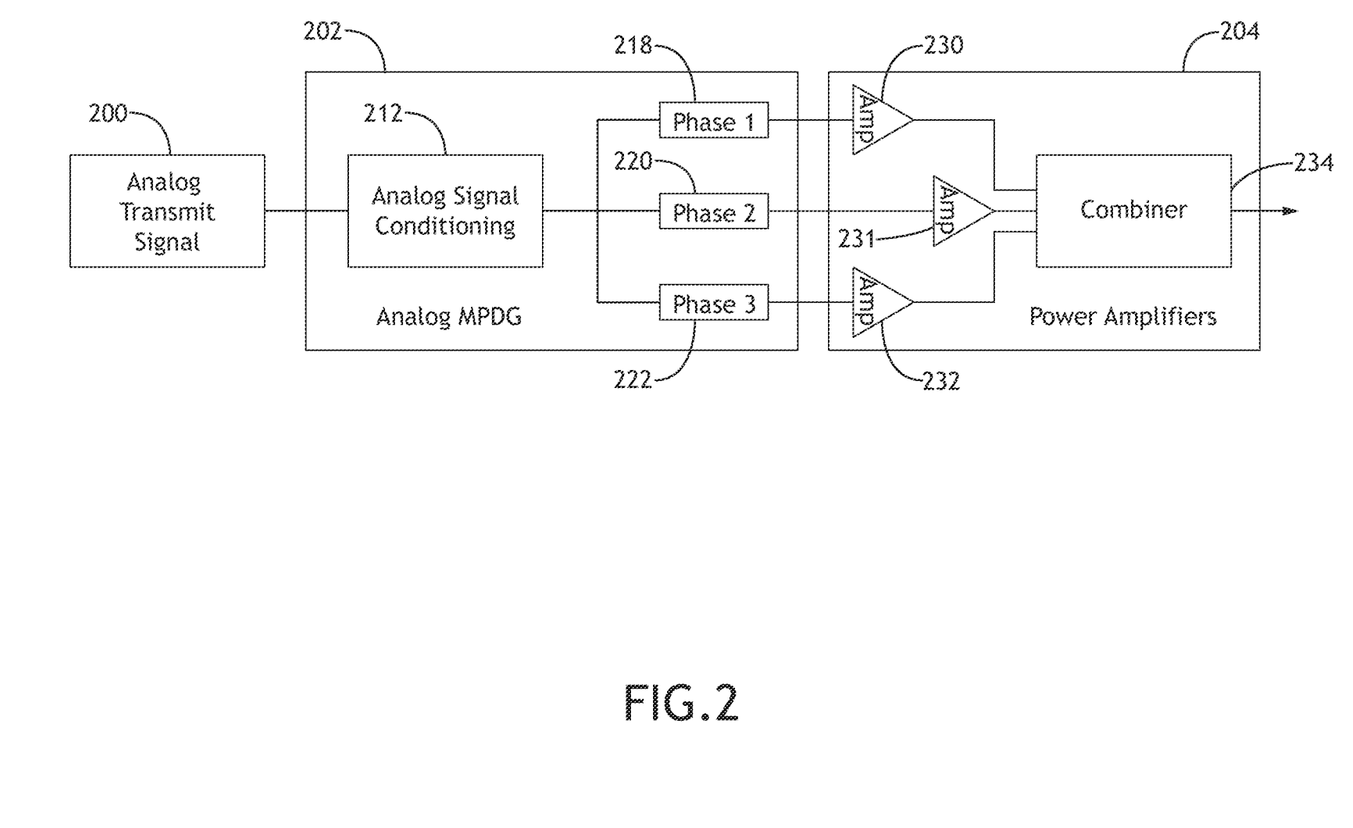
FIG. 2 shows a block diagram of a system for producing a transmit signal.

Referring to FIG. 2, a block diagram of an analog system for producing the drive signals is shown. The analog signals from 200 are received by a conditioner 212 in a multiple phase drive generator 202 that contains elements such as automatic gain control, and slope detection which conditions the signal for later phases of signal processing. The conditioned signals are modified via phase adjustment elements 218, 220, 222, this creates multiple phased drive signals, that will prevent harmonics in the combined output of the Power Amplifier 204. The phase adjusted signals are received by a power amplifier 204 that amplifies using 230, 231,232 and combines the phase adjusted signals with 234 to produce an approximation of the sine wave as in FIG. 1B.

It may be appreciated that the Analog Transmit Signal 200 may produce RF signals as inputs. The resulting analog circuitry to process such RF signals is complex with a large number of components. Furthermore, hand tuning is often required at the board level and again at the line-replaceable unit level.

Figure 3:
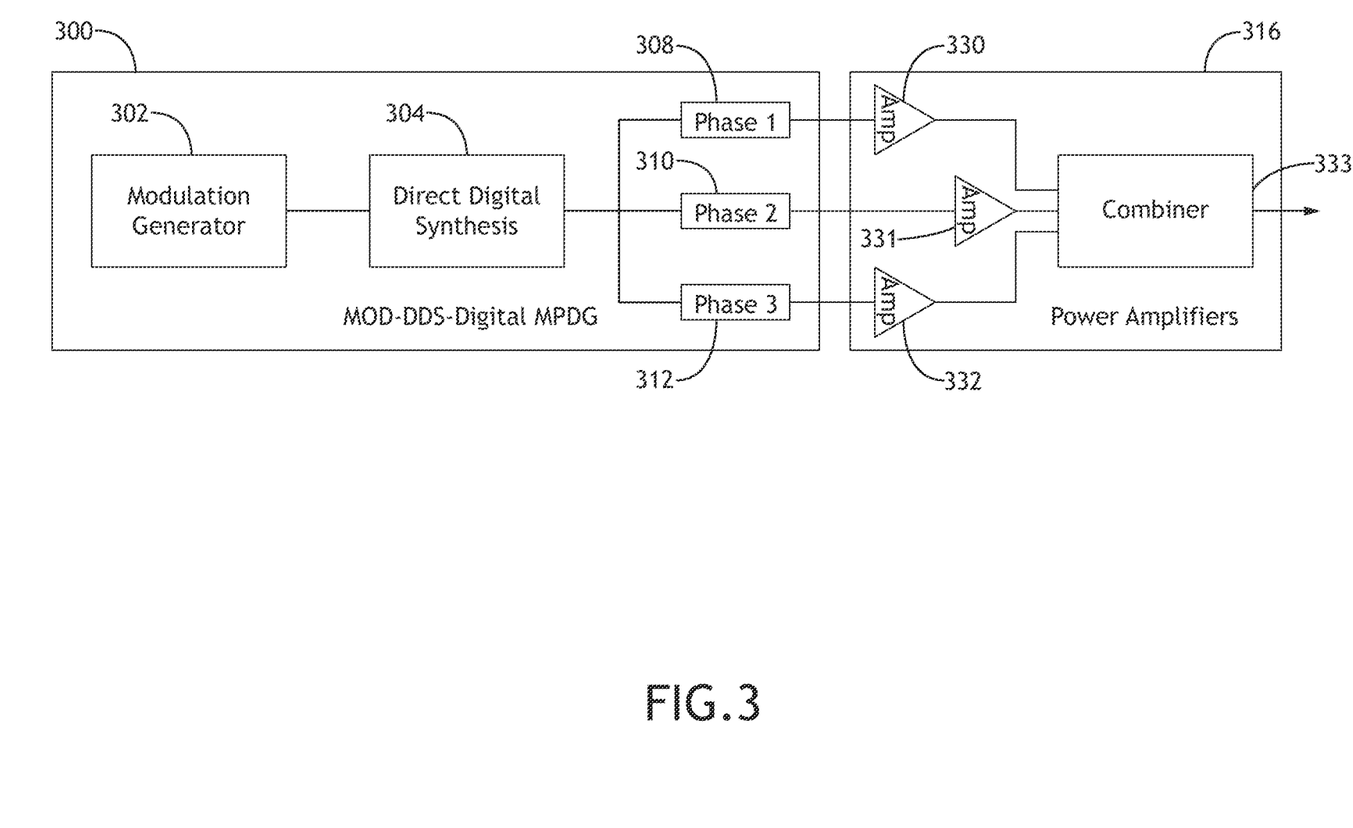
FIG. 3 shows a block diagram of a system according to an exemplary embodiment.

Referring to FIG. 3, a block diagram of a system according to an exemplary embodiment is shown. A multiple phase driver generator 300 includes a modulation generator 302 and a direct digital synthesis element 304 that receives a modulated signal and produces one or more wave forms. Phases of the wave forms are altered via at least two phase adjustment elements 308, 310, 312.

In at least one embodiment, a power amplifier 316 receives the phase adjusted driver signals and outputs an amplified transmit signal. In at least one embodiment, the amplifiers 330, 331, 332 output a positive voltage whenever the phase adjusted drive signal from 308, 310, 312 are "+1, a negative voltage whenever the phase adjusted drive signal from 308, 310, 312 is "−1, and zero voltage whenever the phase adjusted drive signal from 308, 310, 312 are "0". The combiner 333 combines the output of the amplifiers 330, 331, 332 and supplies the amplified transmit signal from 316. It may be appreciated that other comparison algorithms are envisioned provided driver pulses are produced based on a direct comparison of direct digitally synthesized wave forms.

Figure 4:
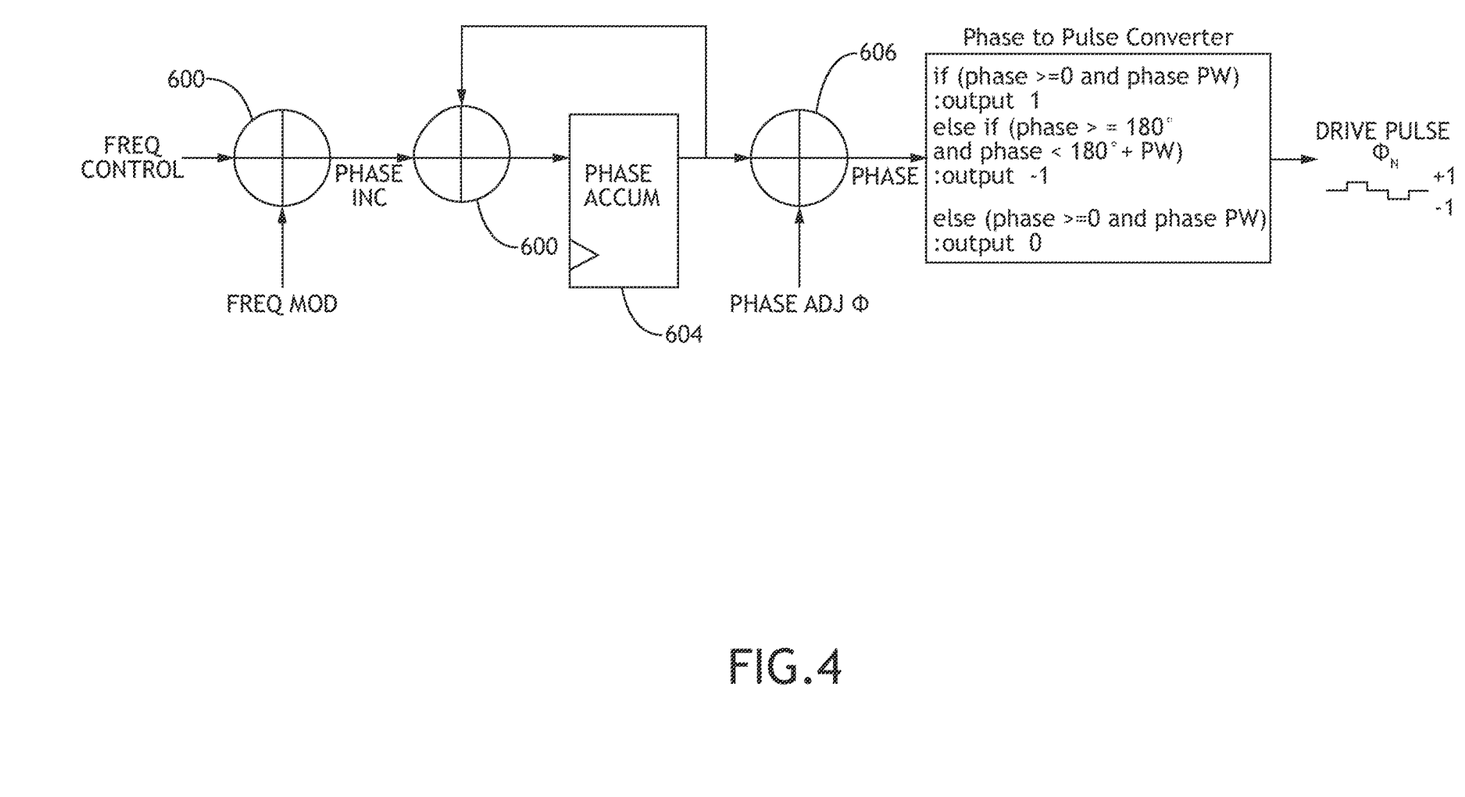
FIG. 4 shows a block diagram of a system according to an exemplary embodiment.

Referring to FIG. 4, a block diagram of a system according to an exemplary embodiment is shown. The system includes a combiner 400 that receives a frequency control signal and a frequency modulation signal, and a combiner 402 and phase accumulator 404 that add the resulting frequency control values at each clock cycle.

A phase adjustment combiner 406, receives the accumulated phase values and applies a predetermined phase offset. The resulting signal is sent to a phase to pulse converter 415. The phase to pulse converter 415 produces a three-state drive pulse based on the current phase and desired pulse width.

In at least one embodiment, the phase discrepancy may be 120° but it should be appreciated that other phase discrepancies are envisioned. Furthermore, more than one set of phase combiner 406 and phase to pulse converter 415 may be utilized where more than one driver pulse signal is desirable.

Figure 5:
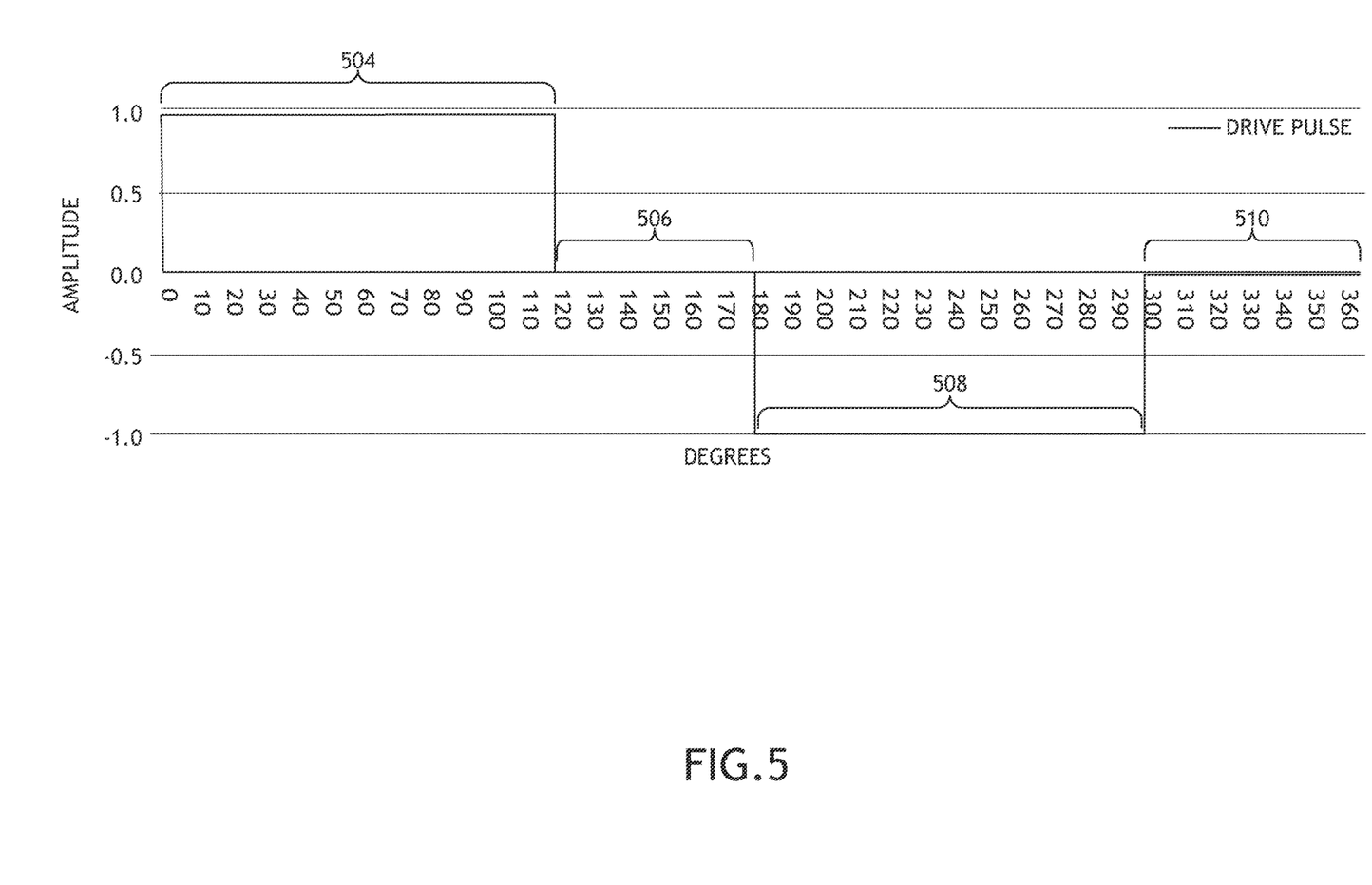
FIG. 5 shows a graph of a representative processes for drive pulses according to an exemplary embodiment.

Referring to FIG. 5, a graph of a representative process for drive pulses according to an exemplary embodiment is shown. The phase to pulse converter 415 outputs a positive digital drive pulse 504 (a high voltage or "1") whenever the phase is between 0° and 120°; a neutral digital drive pulse 506, 610 (a zero voltage or "0") whenever the phase is between 120° and 180°, or between 300° and 360°; and a negative digital drive pulse 508 (a low voltage or "−1") whenever the phase is between 180° and 300°.

In at least one embodiment, the high pulse width 504 and the low pulse width are 120°, but other phase offsets are envisioned. Multiple drive signals may be created using the same technique. Each drive pulse may start at an arbitrary phase and have an arbitrary pulse width. The phase offset and pulse width can be chosen to have the desired combined harmonic response.

Figure 6:
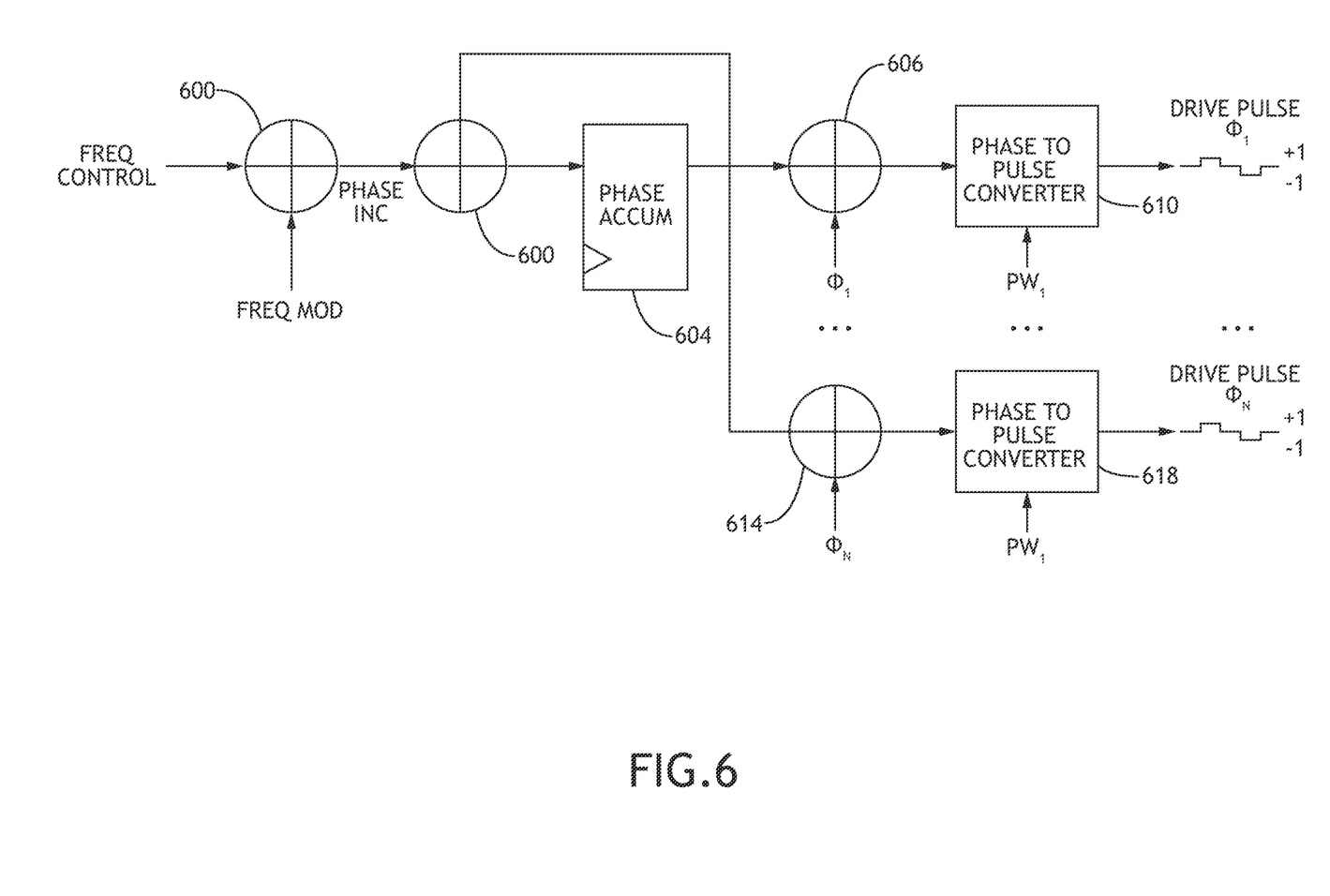
FIG. 6 shows a block diagram of a system according to an exemplary embodiment.

Referring to FIG. 6, a block diagram of a system according to an exemplary embodiment is shown. The system includes a combiner 600 that receives a frequency control signal and a frequency modulation signal, and a combiner 602 and phase accumulator 604 that add the resulting frequency control values at each clock cycle.

A phase adjustment combiner 606, receives the accumulated phase values and applies a predetermined phase offset $\phi_1$. The resulting signal is sent to a phase to pulse converter 610. The phase to pulse converter 610 produces a three-state drive pulse based on the current phase and desired pulse width.

Furthermore, additional sets of phase combiners 614, the accumulated phase values and applies a predetermined phase offset $\phi_N$. Each resulting signal is sent to a corresponding phase to pulse converter 618. The phase to pulse converter 618 produces a three-state drive pulse based on the current phase and desired pulse width. Any number of additional sets of phase combiners 614, may be utilized with different phase disparate signals, or with signals having the same phase discrepancy, but different phase as compared to any of the other sets of phase combiners 606, 614.

Figure 7:
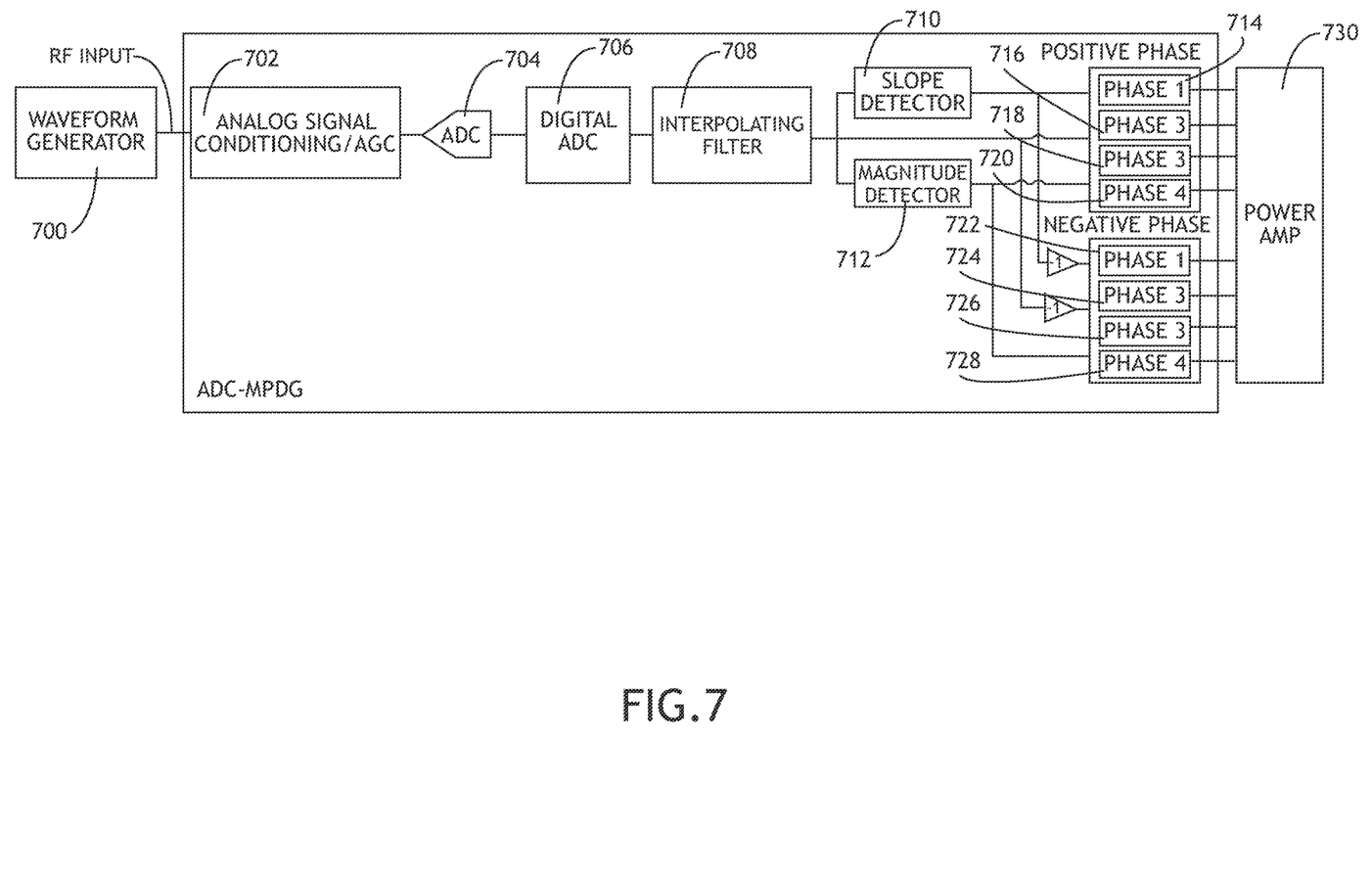
FIG. 7 shows a block diagram of a hybrid system according to an exemplary embodiment.

Referring to FIG. 7, a block diagram of a hybrid system according to an exemplary embodiment is shown. Signal generation is divided between an analog domain process and a digital domain process. In the analog domain, a transmit RF signal is generated via an analog waveform generator 700. An analog-to-digital converter 704 digitizes the transmit RF signal via sampling at least at the Nyquist rate and an interpolating filter 708 increases the sample rate to allow the measurement of a fraction of a degree in phase.

The digitized sinewave is normalized to +/−1. The slope of the digitized RF input is measured via a slope detector 710 to identify a rising or falling portion of the signal, and the amplitude of the digitized RF input is then measured by a magnitude detector 712; based on those measurements, a plurality of phase generators 714, 716, 718, 720, 722, 724, 726, 728 generate pulse outputs, each with a desired phase and pulse width based on a phasing plan. In at least one embodiment, when the digitized RF input has a rising slope and an amplitude above a defined "on" value, the drive signal is enabled. The drive signal is left enabled until the slope falls or the amplitude falls below a defined "off" value. In at least one embodiment, the "on" value may be defined by the sine value of an "on" phase, and the "off" value may be defined by the sine value of the "on" phase plus a pulse width.

In at least one embodiment, a four-phase approach may be utilized, but more phases can be used to further reduce harmonic content of the output. The amplitude of the input is compared to the waveform "on" phase scaled by the input magnitude to determine a turn on time of the pulse, using the slope detector 710 to determine rising or falling slope. The amplitude of the input is compared to the waveform "off" phase scaled by the input magnitude to determine the turn off time of the pulse, using the slope detector to determine rising or falling slope. The comparisons are combined with basic logic to create a pulse output that turns on at the desired phase offset, and is held for the desired pulse width. The negative portions of the phase drive are created with duplicate phase generators 722, 724, 726, 728 but the input and the slope detect are multiplied by −1. A power amplifier 730 is then driver by the pulses.

Systems according a such embodiment enable real-time adjustable phasing and pulse width with "soft start", where pulse width can slowly be increased. Furthermore, if an amplifier fails, a more optimal phasing approach can be utilized on-the-fly. In at least one embodiment, driver pulses may be compared to further restrict harmonics.

Embodiments of the present disclosure obviate the need for an RF signal and keeps the phase drives signal generation in the digital domain; the modulation, direct digital synthesis (DDS), and phasing of the drive signals are all implemented in a digital logic device such as a field programmable gate array (FPGA). Within the FPGA, the multiple phases required to drive the power amplifiers are constructed via direct digital synthesis and signal processing techniques.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A method for generating a drive signal comprising:
   determining if a signal phase is within a first phase range via a phase-to-pulse converter, and if so, output a positive voltage pulse;
   determining if the signal phase is within a second phase range or a third phase range via the phase-to-pulse converter, and if so, output a neutral pulse;
   determining if the signal phase is within a fourth phase range via the phase-to-pulse converter, and if so, output a negative voltage; and
   producing a digital drive pulse based on a combination of the positive voltage pulses, neutral pulses, and negative voltage pulses.

2. The method of claim 1, wherein the signal phase is produced via direct digital synthesis.

3. The method of claim 1, wherein the positive pulse and the negative pulse have an adjustable pulse.

4. The method of claim 1, further comprising:
   determining if a second signal phase is within the first phase range via a phase-to-pulse converter, and if so, output a positive voltage pulse;
   determining if the second signal phase is within the second phase range or the third phase range via the phase-to-pulse converter, and if so, output a neutral pulse;
   determining if the second signal phase is within the fourth phase range via the phase-to-pulse converter, and if so, output a negative voltage; and
   producing a second digital drive pulse based on a combination of the positive voltage pulses, neutral pulses, and negative voltage pulses,
   wherein the signal phase and the second signal phase are out of phase.

5. The method of claim 4, further comprising dynamically adjusting a phase difference between the signal phase and the second signal phase.

6. The method of claim 1, further comprising dynamically adjusting the pulse width of the digitally synthesized signals during signal phase generation.

7. The method of claim 1, further comprising dynamically adjusting a phase difference between digitally synthesized signals during signal phase generation.

8. A phase drive generator comprising:
   an analog signal generator configured to generate an RF input signal;
   an analog-to-digital converter configured to sample the RF input signal and produced a digitized signal;
   a slope detector configured to identify a slope of the digitized signal;
   a magnitude detector configured to identify an amplitude of the digitized signal; and
   a plurality of phase generators, each configured to:
      determine if the slope is rising and the amplitude is above a threshold, and if so, output a signal having a first phase and pulse width;
      determine if the slope is falling or the amplitude is below the threshold, and if so, output a signal having a second phase and pulse width; and
      producing a digital drive pulse based on a combination of the first phase and pulse width and the second phase and pulse width.

9. The phase drive generator of claim 8, further comprising an interpolating filter configured to increase a sample rate of the digitized signal.

10. The phase drive generator of claim 8, wherein determining if the slope is rising and the amplitude is above a threshold comprises comparing digitized signal to a sine value of a predefined "on" phase by scaling the predefined "on" phase by the amplitude to determine a turn on time of the digital drive pulse.

11. The phase drive generator of claim 10, wherein determining if the slope is falling or the amplitude is below the threshold comprises comparing digitized signal to a sine value of a predefined "off" phase by scaling the predefined "off" phase by the amplitude to determine a turn off time for the digital drive pulse.

12. The phase drive generator of claim 8, further comprising a plurality of negative phase generators, each configured to:
   multiply the slope by −1 to produce a negative slope;
   multiply the amplitude by −1 to produce a negative amplitude;

determine if the negative slope is rising and the negative amplitude is above a threshold, and if so, output a signal having a third phase and pulse width;

determine if the negative slope is falling or the negative amplitude is below the threshold, and if so, output a signal having a fourth phase and pulse width; and producing a digital drive pulse based on a combination of the third phase and pulse width and the fourth phase and pulse width.

13. The phase drive generator of claim 12, wherein the plurality of phase generators and plurality of negative phase generators are configured to dynamically adjust a phase difference between at least one of the first phase and second phase and at least one of the third phase and fourth phase.

14. The phase drive generator of claim 8, wherein the plurality of phase generators are configured to dynamically adjust the pulse widths of the digitally synthesized signals.

15. The phase drive generator of claim 8, wherein the plurality of phase generators are configured to dynamically adjust a phase difference between digitally synthesized signals during signal phase generation.

16. A radio transmitter comprising:
a signal generator configured to generate a signal having a signal phase; and
a phase-to-pulse converter configured to:
determine if a signal phase is within a first phase range, and if so, output a positive voltage pulse;
determine if the signal phase is within a second phase range or a third phase range, and if so, output a neutral pulse;
determine if the signal phase is within a fourth phase range, and if so, output a negative voltage; and
producing a digital drive pulse based on a combination of the positive voltage pulses, neutral pulses, and negative voltage pulses.

17. The radio transmitter of claim 16, further comprising:
a second signal generator configured to generate a second signal having a signal phase; and
a second phase-to-pulse converter configured to:
determine if the second signal phase is within the first phase range, and if so, output a positive voltage pulse;
determine if the second signal phase is within the second phase range or the third phase range, and if so, output a neutral pulse;
determine if the second signal phase is within the fourth phase range, and if so, output a negative voltage; and
produce a second digital drive pulse based on a combination of the positive voltage pulses, neutral pulses, and negative voltage pulses,
wherein the signal phase and the second signal phase are out of phase.

18. The radio transmitter of claim 17, wherein the signal generator and second signal generator are configured to dynamically adjust a phase difference between the signal phase and the second signal phase.

19. The radio transmitter of claim 17, wherein signal phase and the second signal phase define a distinct pulse width.

20. The radio transmitter of claim 17, wherein the first signal generator and second signal generator are configured to dynamically adjusting a phase difference between digitally synthesized signals during signal phase generation.

* * * * *